United States Patent [19]
Kim et al.

[11] Patent Number: 5,631,185
[45] Date of Patent: May 20, 1997

[54] METHOD FOR MANUFACTURING CAPACITOR OF SEMICONDUCTOR MEMORY DEVICE

[75] Inventors: Young-pil Kim, Suwon; Jong-bok Kim, Seongnam; Kweon-jae Lee, Suwon, all of Rep. of Korea

[73] Assignee: Samsung Electronics Co., Ltd., Suwon, Rep. of Korea

[21] Appl. No.: 499,327

[22] Filed: Jul. 7, 1995

[30] Foreign Application Priority Data

Jul. 8, 1994 [KR] Rep. of Korea ............... 94-16453

[51] Int. Cl.$^6$ ..................... H01L 21/70; H01L 27/00
[52] U.S. Cl. ..................................... 438/397
[58] Field of Search ...................... 437/52, 60, 919; 148/DIG. 14

[56] References Cited

U.S. PATENT DOCUMENTS

| | | | |
|---|---|---|---|
| 5,053,351 | 10/1991 | Fazan et al. | 437/52 |
| 5,286,668 | 2/1994 | Chou | 437/52 |
| 5,422,295 | 6/1995 | Choi et al. | 437/52 |

*Primary Examiner*—Jey Tsai
*Attorney, Agent, or Firm*—Cushman Darby & Cushman, IP Group of Pillsbury Madison & Sutro LLP

[57] ABSTRACT

A method for manufacturing a capacitor of a semiconductor memory device is provided. A first insulating layer and a second insulating layer are formed in sequence on a semiconductor substrate on which a transistor including a source region, a drain region and a gate electrode, and a buried bit-line surrounded by insulating layer are formed. Then, a contact hole is formed by sequentially etching the layers stacked on the source region, by which the source region of the transistor is exposed, and a spacer made of an insulating substance is formed inside the contact hole, and a first conductive layer is formed on the whole surface of the resultant. Next, the first conductive layer and second insulating layer are etched, and a second conductive layer is formed on the whole surface of the resultant, and a storage electrode is formed by etching the second conductive layer using the first conductive layer as a mask. According to the method, the step for forming the contact hole is very simple and less photolithography steps are required since the first conductive layer is used as a mask for etching the second conductive layer, thereby simplifying the manufacturing process.

7 Claims, 12 Drawing Sheets

METHOD FOR MANUFACTURING CAPACITOR OF SEMICONDUCTOR MEMORY DEVICE

BACKGROUND OF THE INVENTION

The present invention relates to a method for manufacturing a capacitor of a semiconductor memory device, and more particularly, to a method for manufacturing a capacitor of a semiconductor memory device having high cell capacitance and increased reliability in a dynamic random access memory (DRAM) device constructed by integrating a plurality of cells each of which consists a transmitting transistor and a charge-storage area of the capacitor.

As the integration of a semiconductor memory device is increased, the area occupied by each cell is decreased. Generally, if the cell size is decreased, the effective area of a charge-storage capacitor is decreased, and as a result, its capacitance is also decreased. Such a decrease in the capacitance of DRAM cells increases a soft error rate and lowers the refresh function of the cell. Thus, a method for increasing cell capacitance by enlarging the effective area of the capacitor, to compensate for the decrease of the cell size, has been widely sought. This kind of method for increasing the cell capacitance has been an objective in the high-integration of semiconductor memory devices. Among the methods are a stacked structure in which a capacitor is formed by stacking a plurality of layers on a silicon substrate, and a trench structure in which a capacitor is formed by trenching a semiconductor substrate.

Figure 1:
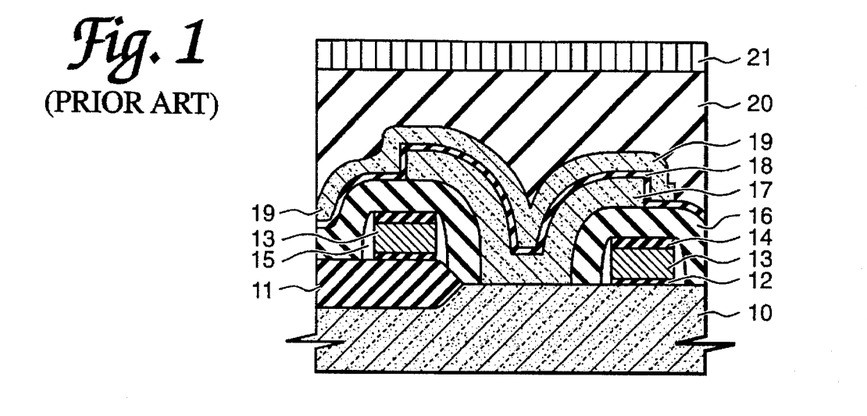
FIG. 1 is a cross-sectional diagram of a conventional stacked capacitor (STC)

FIG. 1 is a cross-sectional view of the structure of a typical stacked capacitor. Here, a field oxide layer 11 for device isolation, a gate electrode pattern consisting of a gate oxide layer 12, a gate conductive layer 13 and an upper insulating layer 14 are formed on a semiconductor substrate 10. A spacer 15 for forming a self-aligned contact on the side wall of the gate electrode pattern and a first insulating layer 16 for insulating the gate electrode is formed on the gate electrode pattern. A storage electrode 17, a dielectric layer 18 and a plate electrode 19 are formed on first insulating layer 16 and semiconductor substrate 10, to thereby construct a capacitor, and a second insulating layer 20 and a bit-line 21 are formed on plate electrode 19.

In the stacked capacitor (STC) structure discussed above, only the top surface area of the storage electrode is used for the charge-storage of the capacitor. Thus, the STC structure cannot provide a suitable cell capacitance for smaller cells, which has been the ongoing trend according in higher integration of semiconductor memory devices, such as 16 Mb DRAM devices and beyond. To solve this problem, a new single stacked wrap (SSW) structure has been developed.

Figure 2:
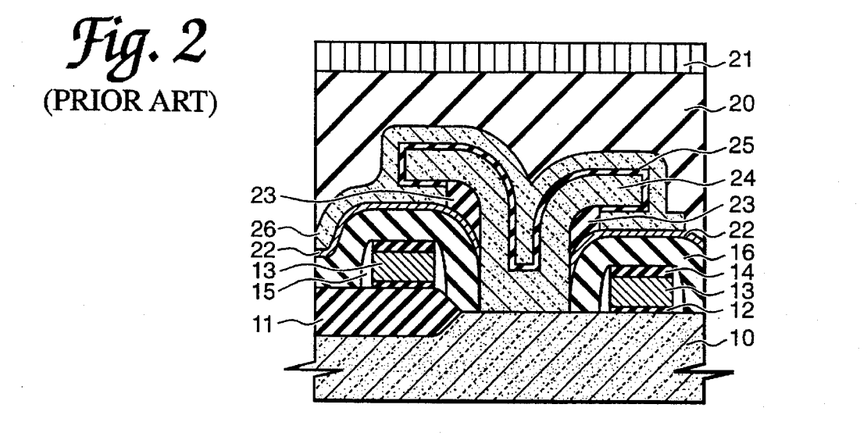
FIG. 2 is a cross-sectional diagram of a conventional single stacked wrap (SSW) structured capacitor.

FIG. 2 is a cross-sectional diagram of the SSW structure, and the same reference numerals of FIG. 2 as those of FIG. 1 represent the same components.

Referring to FIG. 2, differently from the STC structure, dielectric layer 25 and plate electrode 26 are formed by additionally using a part of the lower surface of storage electrode 24 as an effective capacitor area, and a nitride layer 22 and an oxide layer 23 are further formed on the first insulating layer 16.

In this SSW structure, since the upper top and a part of lower surfaces of the storage electrode are used for the charge storage of the capacitor, the cell capacitance is increased compared with that of the STC structure. Here, however, the SSW structure cannot provide a suitable cell capacitance for the smaller cells, such as for 16 Mb DRAM devices and beyond either.

Figure 3:
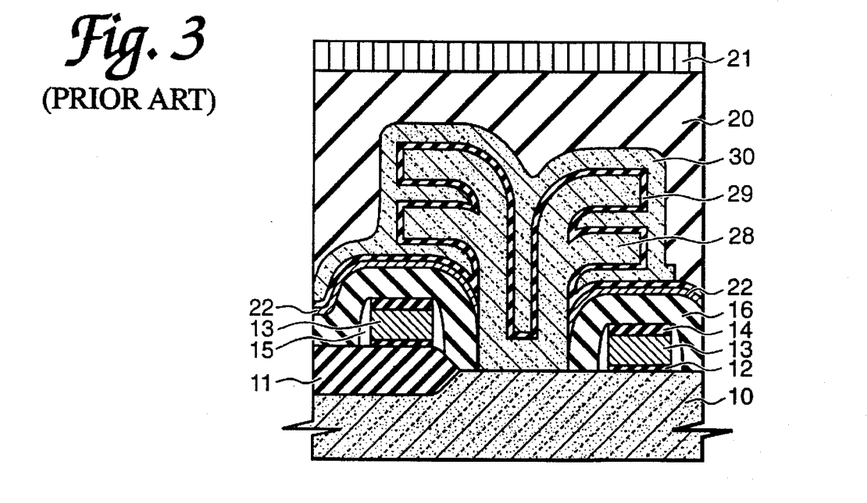
FIG. 3 is a cross-sectional diagram of a conventional fin structured capacitor.

Thus, as shown in FIG. 3, a fin structure capacitor is recommended for securing sufficient cell capacitance.

Referring to FIG. 3, which is a cross-sectional diagram of the fin structure capacitor, storage electrode 28 is constructed as double layers and dielectric layer 29 and plate electrode 30 are formed, to thereby form the capacitor. In this structure, the storage layers can be constructed as multiple layers so that the sufficient effective area of the capacitor can be obtained even though the cell area is small. However, it is difficult to perform the necessary processes. That is, since a polysilicon layer and an oxide layer should be alternately dry-etched during the etching process for forming the storage electrode pattern, much etching equipment is required and processing costs are increased accordingly. Also, due to the multi-layered storage electrode, the topology of the cell is very poor. If the polysilicon layer is not sufficiently over-etched for forming the storage electrode, poly-stringers contaminate the periphery circuitry, to thereby lower the reliability of the memory device.

To improve the above problems, a capacitor having a semi-double fin (SDF) structure has been suggested.

Referring to FIGS. 4A to 4F, the method for manufacturing the capacitor having an SDF structure will be described.

Figure 4A:
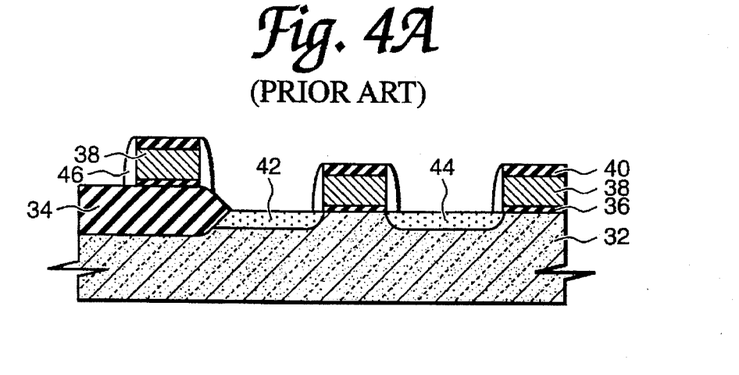
FIGS. 4A to 4F are cross-sectional diagrams illustrating the method for manufacturing a conventional capacitor having a semi-double fin (SDF) structure.

In FIG. 4A, using a device isolating method, a field oxide layer 34 is formed on a semiconductor substrate 32, to define the active regions. Subsequently, after gate insulating layer 36, gate conductive layer 38 and upper insulating layer 40 are stacked, the gate electrode pattern is formed by a photolithography process. Impurity ions are injected into the active region, to form a source region 42 and a drain region 44. Then, spacer 46 is formed on the sidewalls of the gate electrode pattern.

Figure 4B:
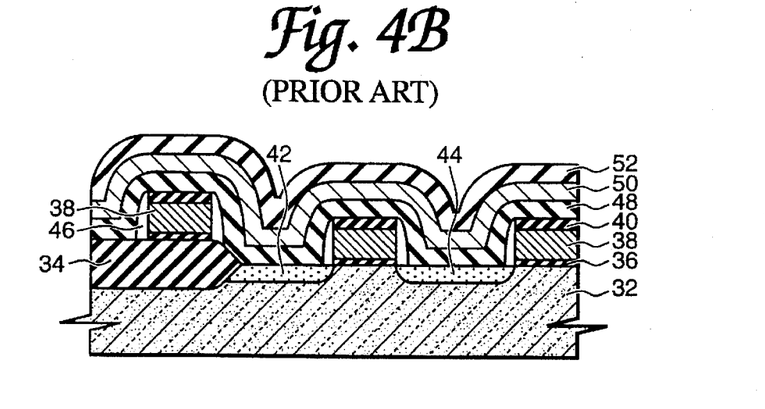

In FIG. 4B, a first insulating layer 48 such as a high-temperature oxide (HTO) layer, a first conductive layer 50 such as a polysilicon layer, and a second insulating layer 52 such as an HTO layer are sequentially stacked on the whole surface of the above resultant structure on which the gate electrode pattern is formed.

Figure 4C:
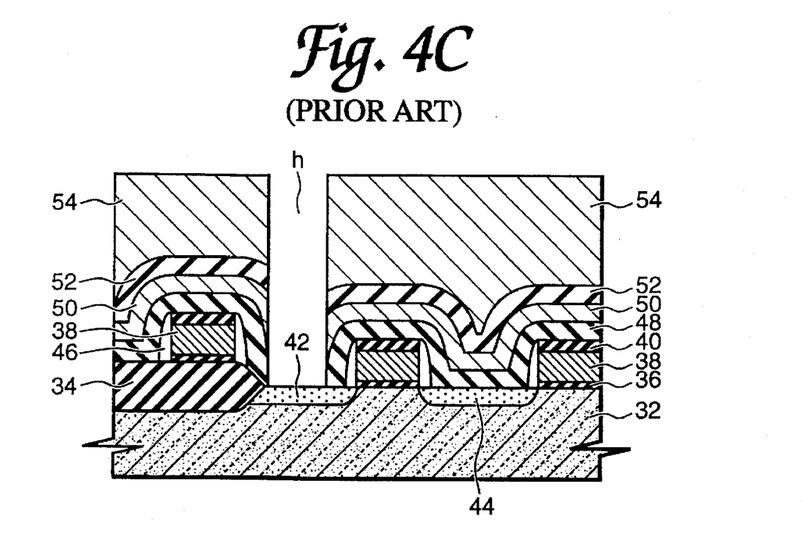

In FIG. 4C, a photoresist is deposited on the second insulating layer 52 and the resultant structure is patterned to form a first photoresist pattern 54. Thereafter, second insulating layer 52, first conductive layer 50 and first insulating layer 48 are sequentially etched to expose source region 42, to thereby form a contact hole h.

Figure 4D:
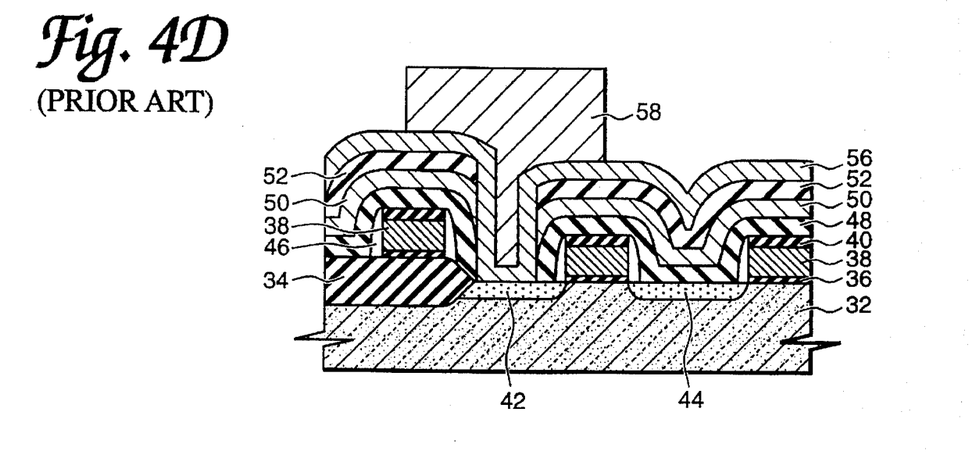

In FIG. 4D, first photoresist pattern 54 is removed and then second conductive layer 56 is formed on the resultant structure on which contact hole h is formed. Thereafter, the photoresist is deposited on second conductive layer 56 and then second photoresist pattern 58 for forming the storage electrode pattern is formed.

Figure 4E:
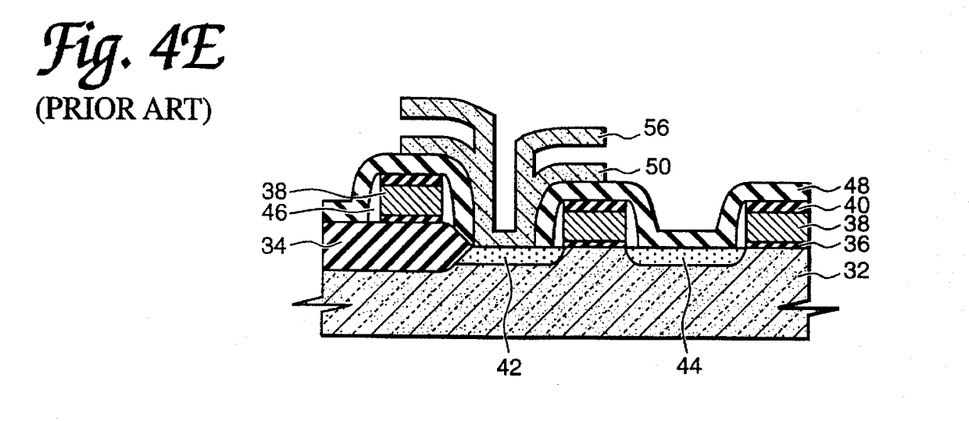

In FIG. 4E, second conductive layer 56 is dry-etched using second photoresist pattern 58 as an etching mask. Then, second insulating layer 52 is wet-etched using a solution such as a buffered oxide etchant (BOE). Then, first conductive layer 50 is dry-etched, to thereby form the storage electrode.

Figure 4F:
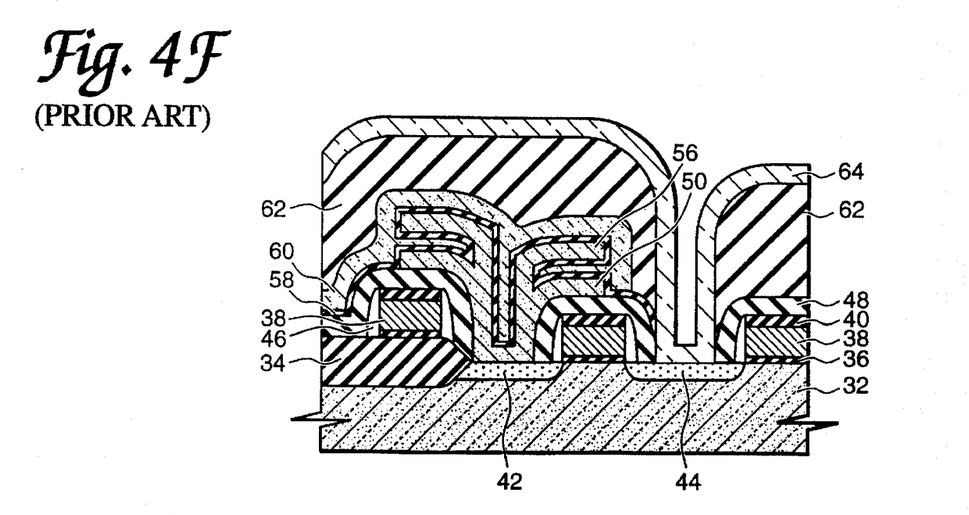

In FIG. 4F, a dielectric layer 58 and a plate electrode 60 and an insulating layer 62 are sequentially etched on the above resultant. Then, a contact hole is formed over drain region 44, and a bit-line 64 is formed.

In contrast to the conventional STC or SSW structure, sufficient cell capacitance is easily secured using the SDF structure. Also, the manufacturing process is simpler than that of the fin-structured capacitor, to thereby provide for excellent reliability.

However, it is difficult for the SDF structure to be applied to a capacitor over bit-line (COB) structure in which the capacitor is formed on the bit-line. In the COB structure, the bit-line is formed prior to capacitor formation, which is in contrast to the conventional structure in which the capacitor is formed before the bit-line. The COB structure will be described with reference to FIGS. 5–7. (Here, too, the same reference numerals represent the same components.)

Figure 5:
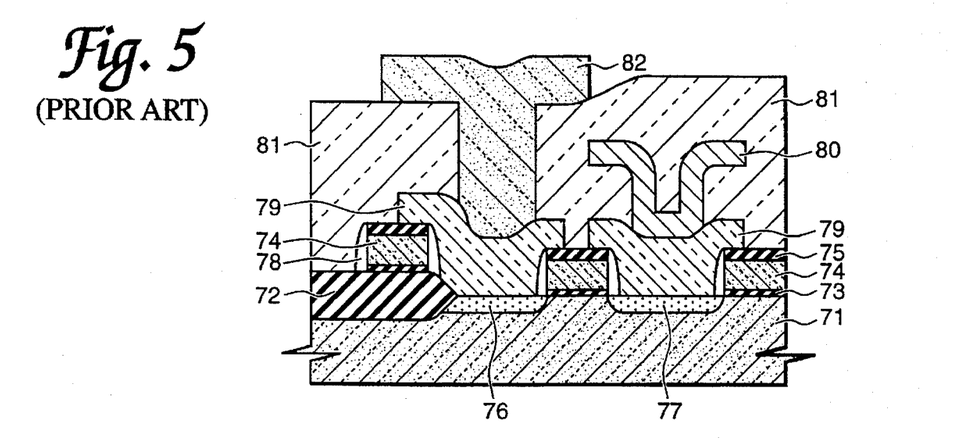
FIGS. 5 and 6 are cross-sectional diagrams of a conventional capacitor having a capacitor over bit-line (COB) structure.

Referring to FIG. 5, a field oxide 72 for device isolation and a gate electrode pattern consisting of a gate insulating layer 73, a gate electrode 74 and an upper insulating layer 75 are formed on a semiconductor substrate 71. A spacer 78 for forming a self-aligned contact is formed on the sidewalls of the gate electrode pattern, and a polysilicon pad 79 is formed on a source region 76 and a drain region 77. On the other hand, bit-line 80 is formed, to be surrounded by an insulating layer such as a boro-phosphorus silicon glass (BPSG) layer 81, on polysilicon pad 79 formed on drain region 77. Also, polysilicon pad 79 formed on source region 76 is connected to a storage electrode 82 via a contact.

As described above, in the COB structure, the bit-line is formed prior to the capacitor. Since the undercut of storage electrode 82 is planarized by BPSG layer 81, the surface area of storage electrode 82 increases. Also, the photolithography process can be easily performed for the cell structure and a sufficient design margin can be secured.

However, in the COB structure, the BPSG layer is used as the insulating layer instead of an HTO layer, for planarizing the storage electrode. Here, the BPSG layer has a greater wet-etching rate than the HTO layer. Thus, during a cleaning process after the contact hole is formed, the side of the BPSG layer is wet-etched by the cleaning solution such as hydrofluoric acid (HF), to thereby enlarge the contact hole. As a result, a void is generated in storage electrode 82 so that reliability is lowered. Also, since storage electrode 82, which is doped within the contact hole, contacts BPSG layer 81 of the side of the hole, the boron and phosphorus of BPSG layer 81 migrates into storage electrode 82 during a subsequent thermal process, which also decreases reliability.

Figure 6:
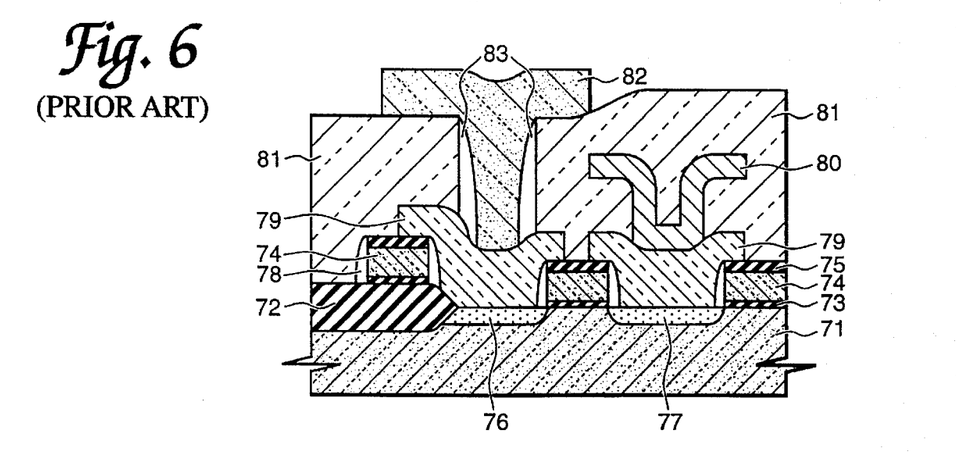

To overcome the above problems, there is recommended a structure in which spacer 83 made of an insulating substance having a low wet-etching rate, such as $Si_3N_4$ or SiON, is formed on the sidewalls of BPSG layer 81 contacting storage electrode 82, as shown in FIG. 6.

Figure 7:
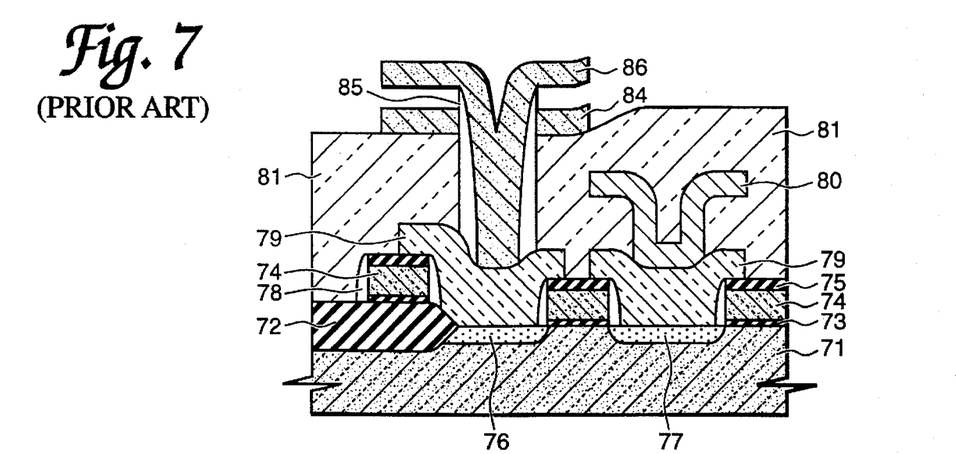
FIG. 7 is a cross-sectional diagram of a capacitor where an SDF structure is applied to a conventional COB structure.

However, when the capacitor of the above SDF structure is applied to the COB structure, as shown in FIG. 7, since a first conductive layer 84 and a second conductive layer 86 are separated by a spacer 85 serving as an insulator, there is no contact between first and second conductive layers 84 and 86 within the contact hole.

SUMMARY OF THE INVENTION

It is an object of the present invention to provide a method for manufacturing a capacitor over bit-line (COB) structure having increased cell capacitance.

To achieve the above object, there is provided a method for manufacturing a capacitor of a semiconductor memory device, the method including the steps of: sequentially forming a first insulating layer, a first conductive layer, a second insulating layer, and a second conductive layer whose etching selectivity ratio is smaller than that of the second insulating layer, on a semiconductor substrate on which a transistor comprising a source region, a drain region and a gate electrode, and a buried bit-line surrounded by insulating layer are formed; forming a contact hole by sequentially etching a selected portion of the layers stacked on the source region, thereby exposing the source region of the transistor; forming a spacer made of an insulating material inside the contact hole, while leaving part of the side of the first conductive layer exposed; forming a third conductive layer on the whole surface of the resultant structure having the spacer; forming a photoresist pattern on the third conductive layer for forming a storage electrode; and forming a storage electrode by sequentially etching a selected portion of the third conductive layer, second conductive layer, second insulating layer and first conductive layer.

The first and third conductive layers are made of one of polysilicon doped with arsenic ions or polysilicon doped with phosphorus through $POCl_3$ deposition, the second conductive layer is made of polysilicon, and the first and second insulating layers are made of high-temperature oxide. On the other hand, it is preferable that the spacer is made of $Si_3N_4$ or SION. Also, a polysilicon pad layer may be further formed on the drain and source regions before the bit-line is formed.

Also, to achieve the above object, there is provided a method for manufacturing a capacitor of a semiconductor memory device, including the steps of: forming a first insulating layer, a first conductive layer and a second insulating layer in sequence on a semiconductor substrate on which a transistor comprising a source region, a drain region and a gate electrode, and a buried bit-line surrounded by insulating layer are formed; forming a contact hole by sequentially etching the layers stacked on the source region, thereby exposing the source region of the transistor; forming a spacer made of a conductive material inside the contact hole; forming a second conductive layer on the whole surface of the resultant structure having the spacer; forming a photoresist pattern on the second conductive layer for forming a storage electrode; and forming a storage electrode by sequentially etching the second conductive layer, second insulating layer and first conductive layer.

Here, a polysilicon pad layer may be further formed on the drain and source regions before the bit-line is formed. The spacer is made of undoped polysilicon and changed into a conductive layer through the diffusion of an impurity from the second conductive layer. The first and second conductive layers are made of polysilicon doped with impurities.

Also, to achieve the above object, there is provided a method for manufacturing a capacitor of a semiconductor memory device, including the steps of: forming a first insulating layer and a second insulating layer in sequence on a semiconductor substrate on which a transistor comprising a source region, a drain region and a gate electrode, and a buried bit-line surrounded by insulating layer are formed; forming a contact hole by sequentially etching the layers stacked on the source region, thereby exposing the source region of the transistor; forming a spacer made of an insulating material inside the contact hole; forming a first conductive layer on the whole surface of the resultant having the spacer; forming a photoresist pattern on the first conductive layer for forming a storage electrode; etching the first conductive layer and the second insulating layer; forming a second conductive layer on the whole surface of the etched resultant; and forming a storage electrode by etching the second conductive layer using the first conductive layer as a mask.

Here, it is preferable that the first insulating layer is made either one of $Si_3N_4$ and SiON and the second insulating layer is made of high-temperature oxide. Also, a polysilicon pad layer may be further formed on the drain and source regions before the bit-line is formed.

Therefore, when the SDF cell structure is applied to the COB structure, the conductive layers are electrically connected to become a fin of a storage electrode.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

In FIGS. 8A–8I, 9A–9E and 10A–10F, the same reference numerals represent like components.

Figure 8A:
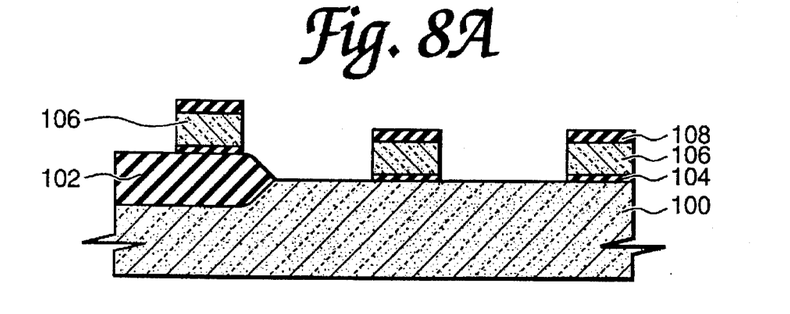
FIGS. 8A to 8I are cross-sectional diagrams illustrating a capacitor manufacturing method according to the first preferred embodiment of the present invention.

FIG. 8A is a diagram illustrating the step of forming the gate electrode pattern. A field oxide layer 102 for isolating the device is formed on a semiconductor substrate 100 by a common method. Next, an insulating layer, a conductive layer and another insulating layer are sequentially stacked and the resultant structure is patterned, to thereby form the gate electrode pattern consisting of a gate insulating layer 104, a gate electrode 106 and an upper insulating layer 108.

Figure 8B:
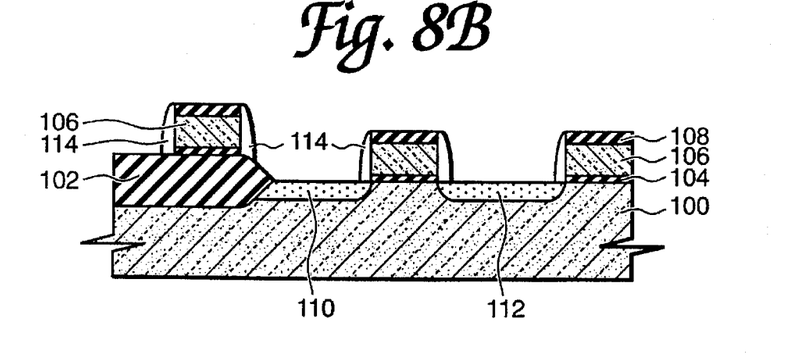
Figure 8C:
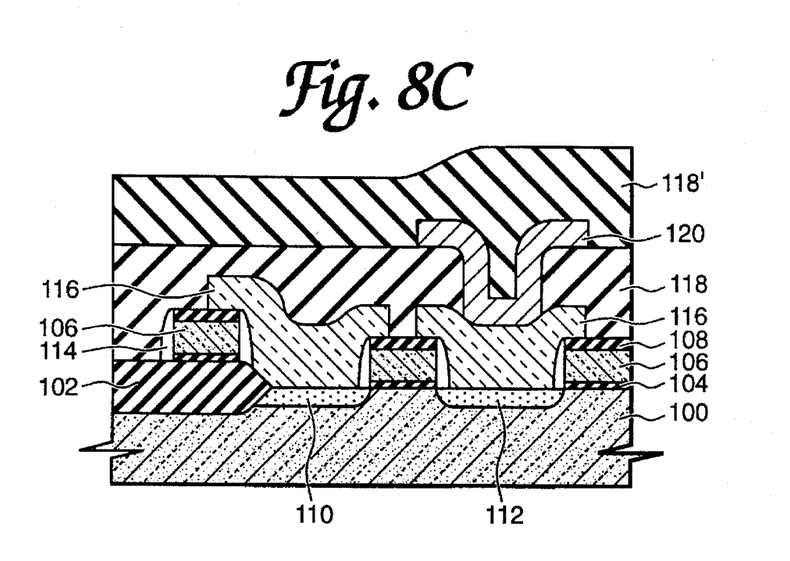

FIG. 8B is a diagram illustrating the step of forming a source region 110 and a drain region 112. An impurity is injected into substrate 100 using the gate electrode pattern as a mask, to thereby form source 110 and drain 112. Here, since upper insulating layer 108 functions as a mask, the impurity is not injected into gate electrode 106. Next, an HTO layer is formed on the whole substrate and the resultant structure is anisotropic-etched, to thereby form a spacer 114 on the sidewalls of the gate electrode pattern, FIG. 8C is a diagram illustrating the step of forming a buried bit-line 120. A doped polysilicon layer is deposited on the whole resultant structure having spacer 114, which is then patterned so that a polysilicon pad 116 is formed on the source and drain. Subsequently, an insulating layer such as a BPSG layer 118 is formed on the whole substrate, which is then etched to expose polysilicon pad 116 formed on the drain. Also, a conductive layer is deposited on BPSG layer 118 and the exposed portion of polysilicon pad 116 and the resultant structure is patterned to form a buried bit-line 120. Then, BPSG layer 118' is stacked sufficiently to cover bit-line 120 on the whole surface of the above resultant having bit-line 120. Here, polysilicon pad 116 has a function for increasing the alignment margin of the contact hole and, if the cell size is sufficiently large, may not need to be formed.

Figure 8D:
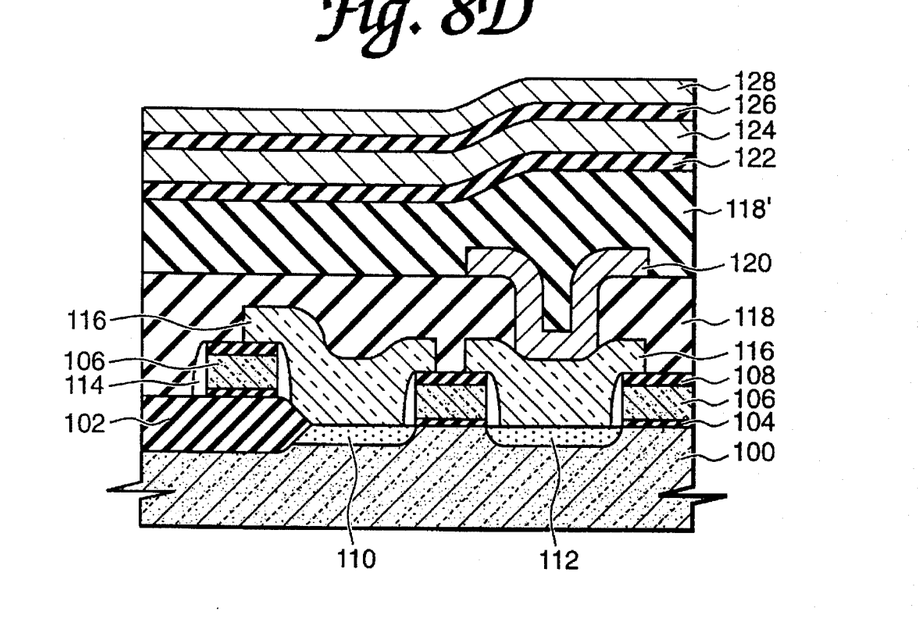

FIG. 8D is a diagram illustrating the step of forming a first conductive layer 124. A first insulating layer 122 such as an HTO layer, a first conductive layer 124 such as a doped polysilicon layer, a second insulating layer 126 such as an HTO layer having a higher etching selectivity ratio than the following second conductive layer, and a second conductive layer 128 made of material such as polysilicon are stacked in sequence on BPSG layer 118'. Here, first conductive layer 124 may be formed with polysilicon doped with arsenic ions or polysilicon doped with phosphorous through $POCl_3$ deposition. First insulating layer 122 is for preventing bit-line 120 from oxidation during a subsequent thermal process and may not need to be formed if the thermal process is performed at a low temperature.

Figure 8E:
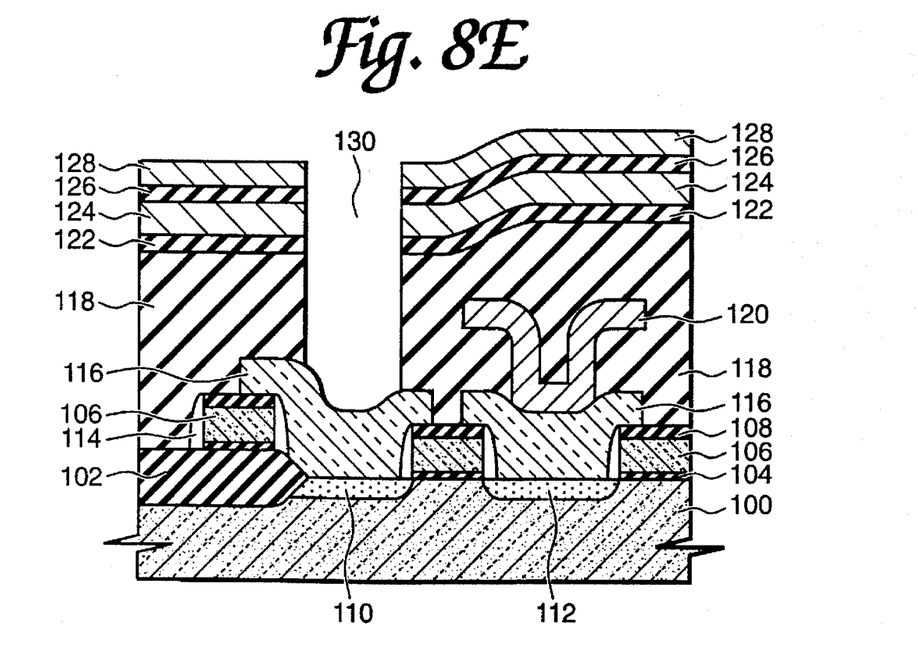

FIG. 8E is a diagram illustrating the step of forming a contact hole 130. A photoresist is deposited on the second conductive layer 128 and the resultant structure is patterned, so that a photoresist pattern (not shown) for forming contact hole 130 is formed. Subsequently, second conductive layer 128, second insulating layer 126, first conductive layer 124, first insulating layer 122 and BPSG layers 118 and 118' (hereinafter referred to jointly, as merely BPSG layer 118) are dry-etched in sequence, to thereby form contact hole 130 by which polysilicon pad 116 formed on source 110 is exposed. Then, the photoresist pattern is removed and the semiconductor substrate is cleaned. Here, it is preferable that HF solution is excluded from the cleaning solution.

Figure 8F:
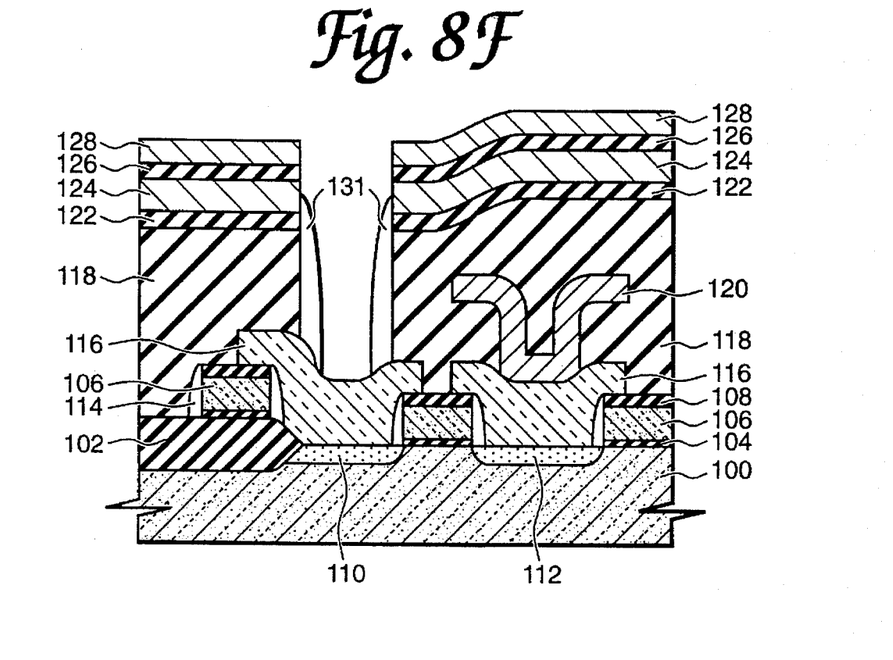

FIG. 8F is a diagram illustrating the step of forming a spacer 131. After contact hole 130 is formed, a third insulating layer (not shown) such as an SiON layer is formed on the whole substrate and the resultant structure is dry-etched, to thereby form spacer 131 inside contact hole 130. Here, third insulating layer may be made of $Si_3N_4$, and should be over-etched to expose a part of the side of the first conductive layer 124 so that the first conductive layer can contact the following third conductive layer. During this etching process, a second conductive layer 128 functions to prevent the second insulating layer 126 from being etched. After spacer 131 is formed, contact hole 130 is not enlarged even if HF solution is used for the cleaning step.

Figure 8G:
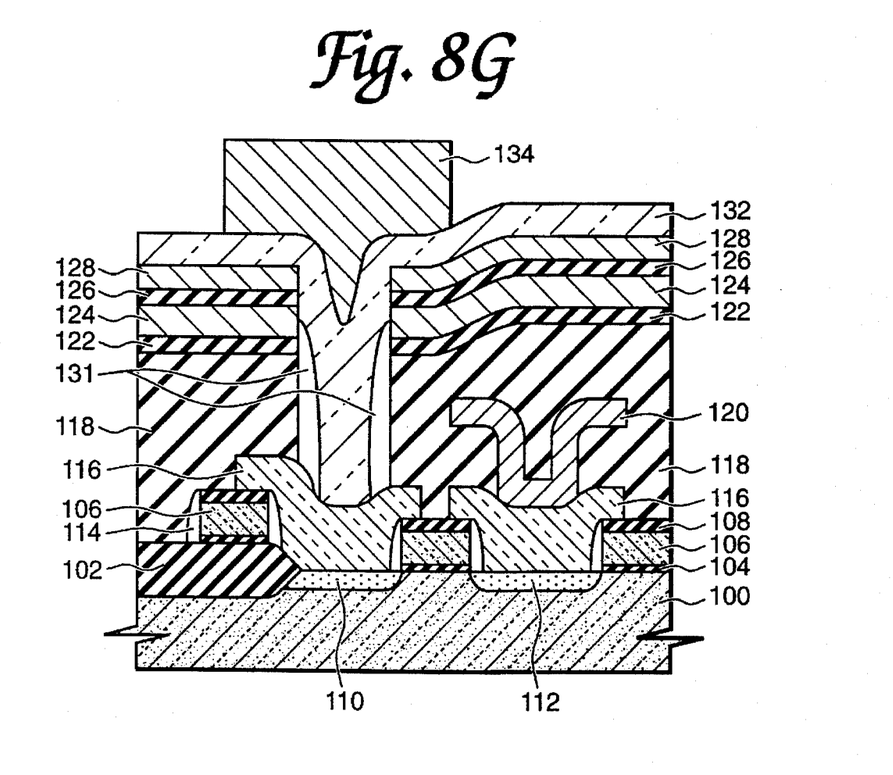

FIG. 8G is a diagram illustrating the step of forming the third conductive layer 132. After spacer 131 is formed, third conductive layer 132 is formed on the whole surface of the resultant structure. Here, third conductive layer 132 is made of doped polysilicon and is the same substance as that of the first conductive layer 124. Then, a photoresist layer is formed on third conductive layer 132 and the resultant structure is patterned, to thereby form a photoresist pattern 134.

Figure 8H:
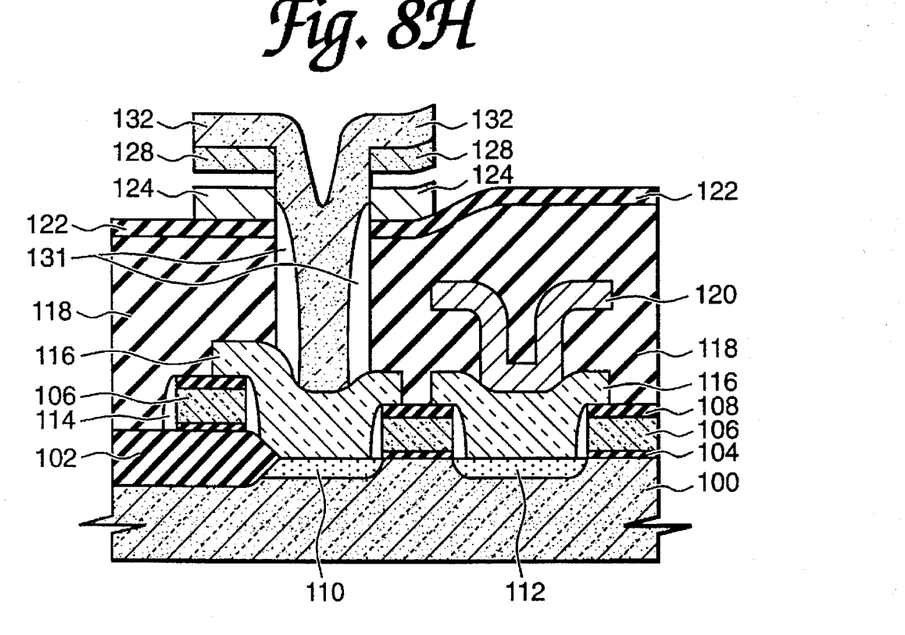

FIG. 8H is a diagram illustrating the step of forming a storage electrode. After third conductive layer 132 and second conductive layer 128 are dry-etched using photoresist pattern 134 as a mask, second insulating layer 124 is wet-etched. Here, as an etchant, a BOE or HF solution is used. Next, first conductive layer 124 is dry-etched, to thereby form the storage electrode having first conductive layer 124, second conductive layer 128 and third conductive layer 132.

Figure 8I:
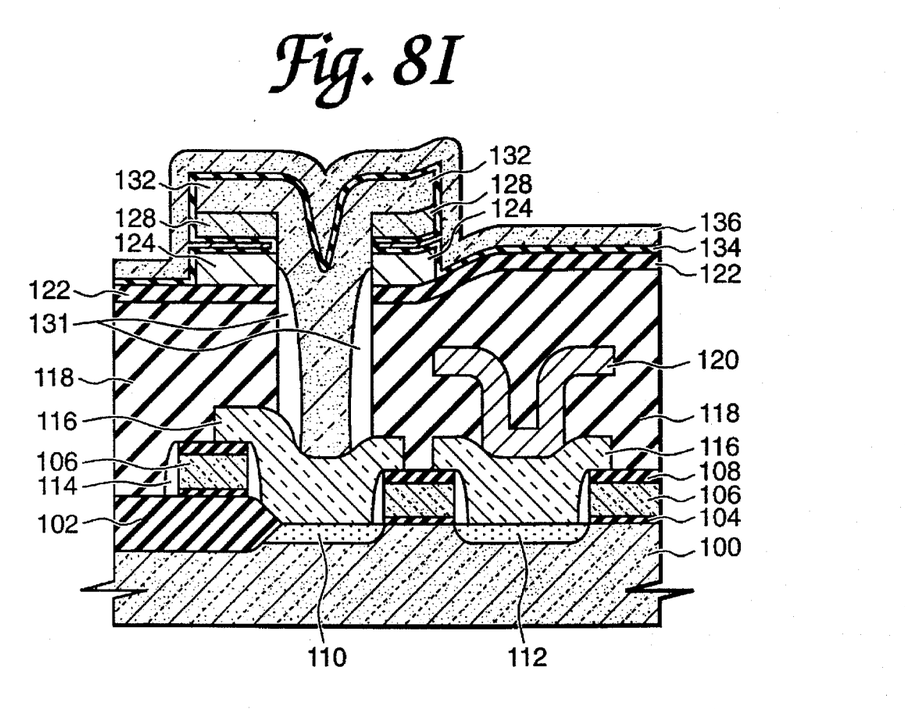

FIG. 8I is a diagram illustrating the step of forming a plate electrode 136. A dielectric layer 134 such as an oxide/nitride/oxide layer is formed on the whole surface of the storage electrode. Then, a conductive material is stacked on the whole resultant structure to form the plate electrode 136, thus completing the capacitor.

According to the first preferred embodiment of the present invention, an insulating spacer is formed inside the contact hole and is over-etched. As a result, part of first conductive layer contacts the third conductive layer so that the first conductive layer becomes a fin of the storage electrode.

FIGS. 9A to 9D are cross-sectional diagrams illustrating the capacitor manufacturing method according to the second preferred embodiment of the present invention. Here, differently from the first preferred embodiment, a spacer is formed to be conductive so that the first and second conductive layers are electrically connected. All manufacturing steps, other than the above step, are performed in the same manner as the first preferred embodiment.

Figure 9A:
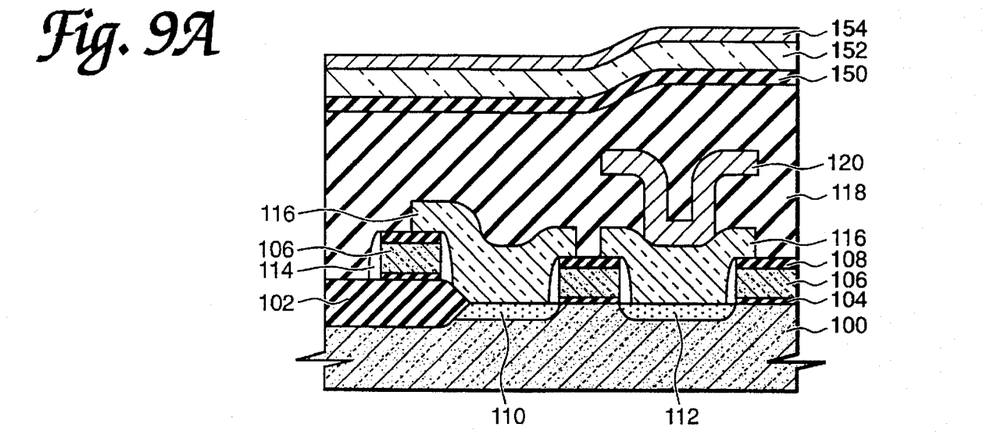
FIGS. 9A to 9E are cross-sectional diagrams illustrating a capacitor manufacturing method according to the second preferred embodiment of the present invention.

FIG. 9A is a diagram illustrating the step of forming a first insulating layer 150, a first conductive layer 152 and a second insulating layer 154. First insulating layer 150 such as an HTO layer, first conductive layer 152 such as a doped polysilicon layer, and second insulating layer 154 such as an HTO layer are stacked on BPSG layer 118 in sequence. Here, first conductive layer 124 may be polysilicon doped with arsenic ions or polysilicon doped with phosphorus through $POCl_3$ deposition, as in the first preferred embodiment. First insulating layer 150 is for protecting bit-line 120 from oxidation during a subsequent thermal process and may not need to be formed if the thermal process is performed at a low temperature.

Figure 9B:
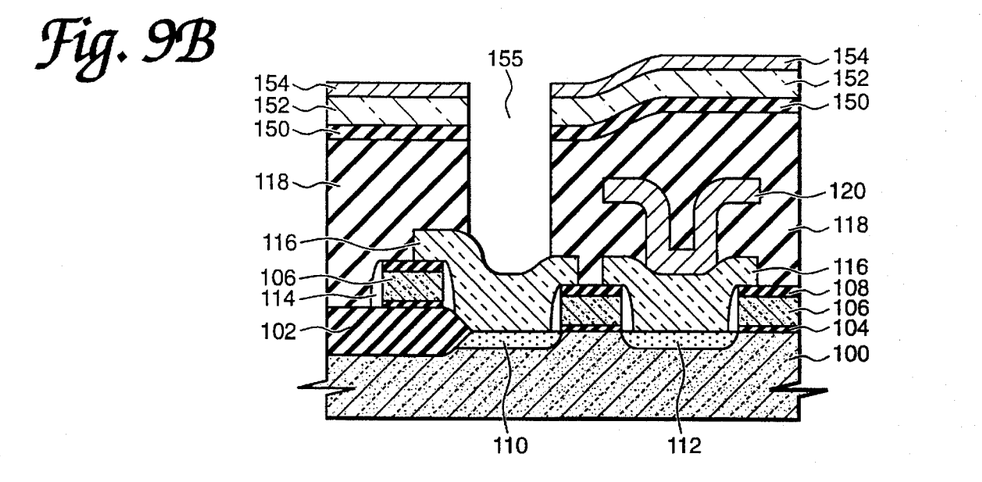

FIG. 9B is a diagram illustrating the step of forming a contact hole 155. Here, a photoresist is deposited on second conductive layer 154 and patterned so that a photoresist pattern (not shown) for forming contact hole 155 is formed. Subsequently, second insulating layer 154, first conductive layer 152, first insulating layer 150 and BPSG layer 118 are dry-etched in sequence, to thereby form contact hole 155 by which polysilicon pad 116 formed on source 110 is exposed. Then, the photoresist pattern is removed and the semiconductor substrate is cleaned. Here, it is preferable that HF solution is excluded from the cleaning solution.

Figure 9C:
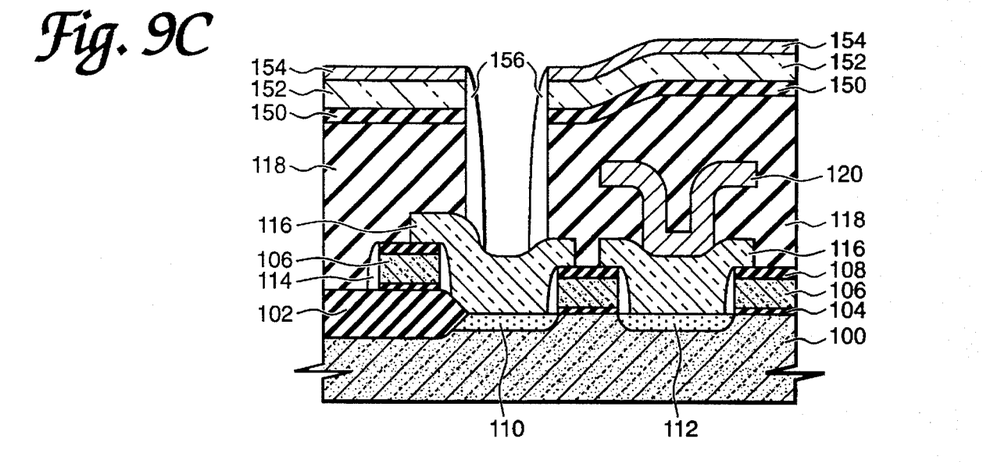

FIG. 9C is a diagram illustrating the step of forming a spacer 156. After contact hole 155 is formed, a conductive layer (not shown) is formed on the whole substrate and the resultant structure is dry-etched, to thereby form spacer 156 inside contact hole 155. Here, alternatively spacer 156 can be made of undoped polysilicon at first and made to be conductive layer as it becomes doped by impurity diffusion from a second conductive layer 158, which will be formed later, by thermal processing during a later step of forming a dielectric layer or BPSG layer. After spacer 156 is formed, contact hole 155 is not enlarged even if HF solution is used for the cleaning step.

Figure 9D:
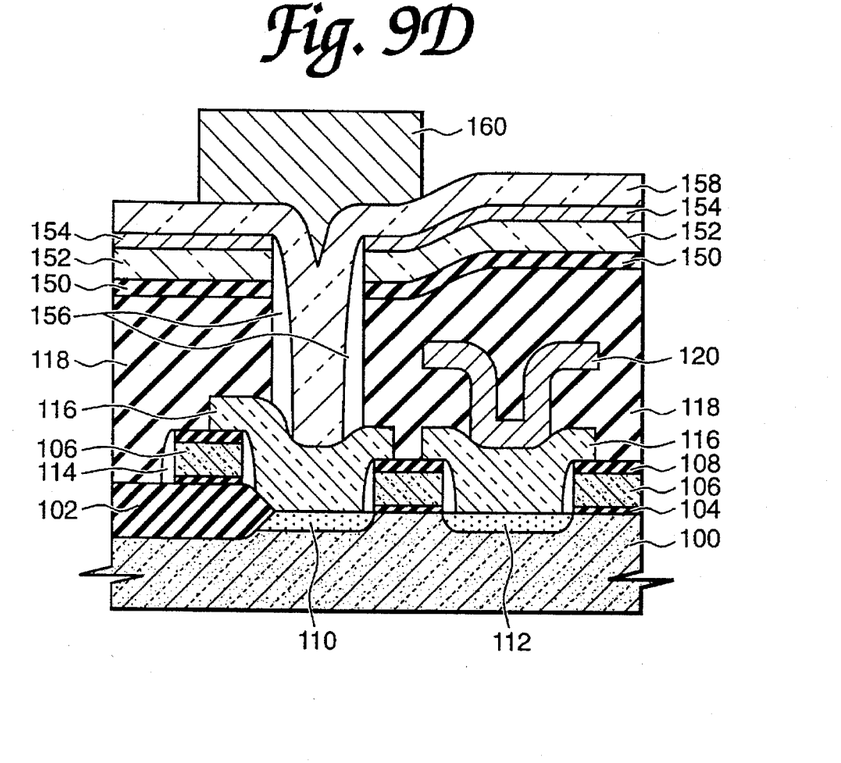

FIG. 9D is a diagram illustrating the step of forming the second conductive layer 158. After spacer 156 is formed, second conductive layer 158 is formed on the whole surface of the resultant structure. Here, second conductive layer 158 is made of doped polysilicon and is the same substance as that of first conductive layer 152. Then, photoresist is deposited on second conductive layer 158 and patterned to thereby form a photoresist pattern 160.

Figure 9E:
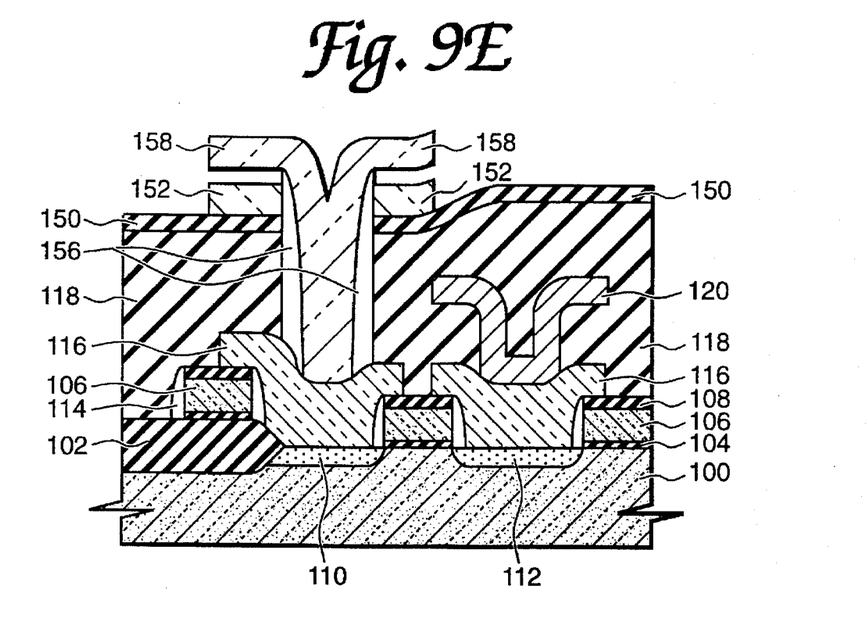

FIG. 9E is a diagram illustrating the step of forming a storage electrode. After second conductive layer 158 is dry-etched using photoresist pattern 160 as a mask, second insulating layer 124 is wet-etched. Next, first conductive layer 152 is dry-etched, to thereby form the storage electrode consisting of first conductive layer 152 and second conductive layer 158.

According to the second preferred embodiment of the present invention, the spacer is formed of undoped polysilicon, then becomes doped through the impurity diffusion from the doped second conductive layer. As a result, the first and second conductive layers are connected, so that the first conductive layer becomes a fin of the storage electrode.

FIGS. 10A to 10F are diagrams illustrating the capacitor manufacturing method according to third preferred embodiment of the present invention. In this preferred embodiment, the insulating spacer is formed inside a contact hole, and the first and second conductive layers are connected outside contact hole. All manufacturing steps, other than the above step, are performed in the same manner as the first preferred embodiment.

Figure 10A:
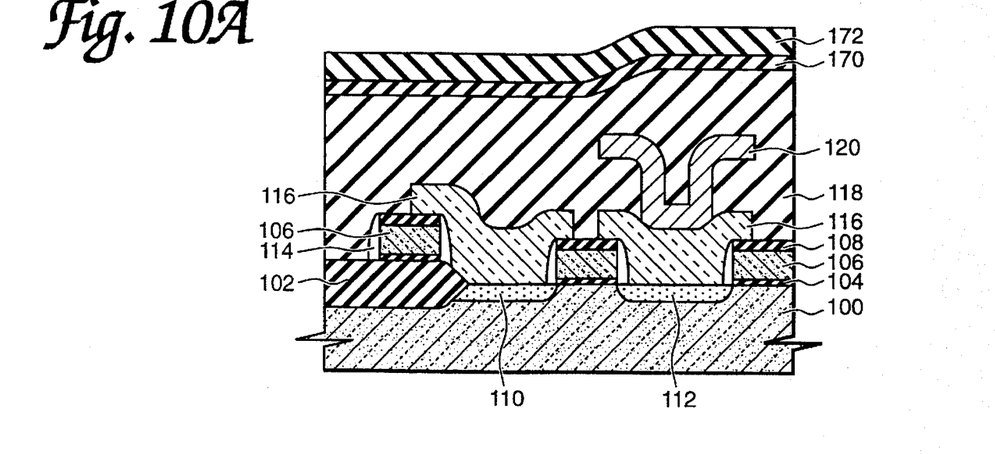
FIGS. 10A to 10F are cross-sectional diagrams illustrating a capacitor manufacturing method according to the third preferred embodiment of the present invention.

FIG. 10A is a diagram illustrating the step of forming a first insulating layer 170 and a second insulating layer 172. First and second insulating layers 170 and 172 are stacked on a BPSG layer 118 in sequence. Here, second insulating layer 172 is made of an HTO layer whose wet-etching selectivity ratio is greater than that of first insulating layer 170, and first insulating layer 170 is made of $Si_3N_4$ or SION. Here, first insulating layer 170 acts as a mask with respect to the BPSG layer which is under first insulating layer 170 during wet-etching of second insulating layer 172.

Figure 10B:
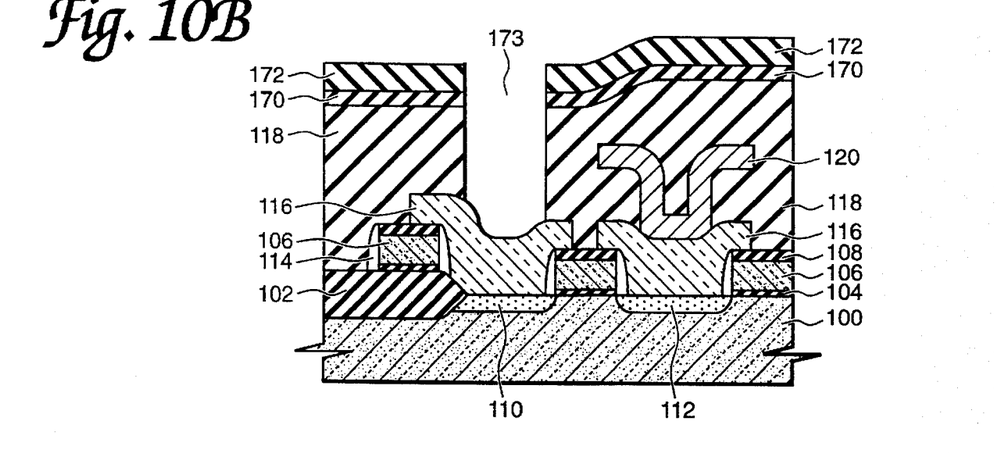

FIG. 10B is a diagram illustrating the step of forming a contact hole 173. A photoresist is deposited on second conductive layer 172 and patterned so that a photoresist pattern (not shown) for forming contact hole 173 is formed. Subsequently, second insulating layer 172, first insulating layer 170 and BPSG layer 118 are dry-etched in sequence, to thereby form contact hole 173 by which polysilicon pad 116 formed on source 110 is exposed. Then, the photoresist pattern is removed.

Figure 10C:
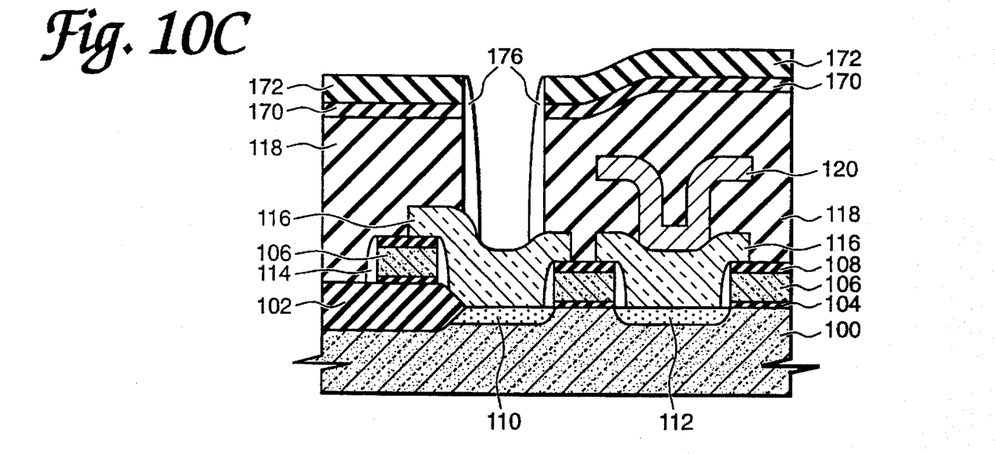

FIG. 10C is a diagram illustrating the step of forming a spacer 176. After contact hole 173 is formed, a third insulating layer (not shown) such as SiON is formed on the whole substrate and the resultant structure is dry-etched, to thereby form spacer 176 inside contact hole 173. Here, in contrast to the first preferred embodiment, spacer 176 is not over-etched.

Figure 10D:
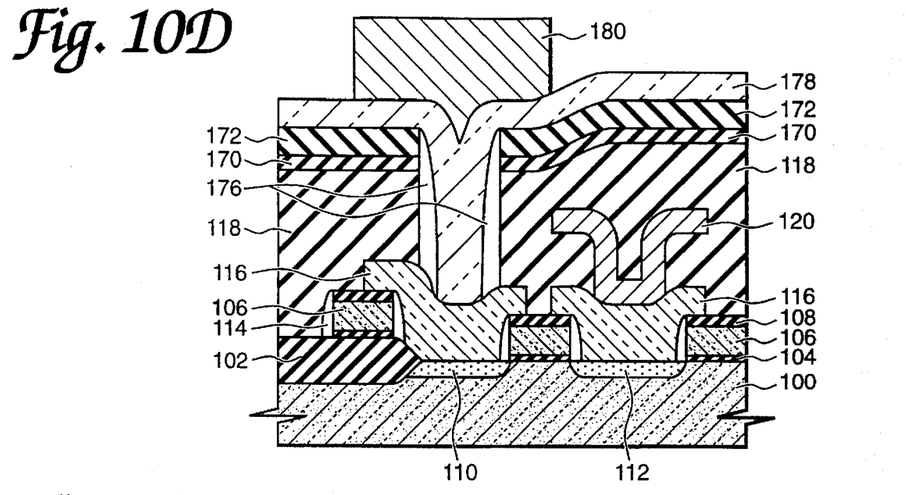

FIG. 10D is a diagram illustrating the step of forming first conductive layer 178. After spacer 176 is formed, first conductive layer 178 is formed on the whole surface of the resultant structure. Here, first conductive layer 178 is doped polysilicon. Then, a photoresist layer is formed on first conductive layer 178 and patterned to thereby form a photoresist pattern 180.

Figure 10E:
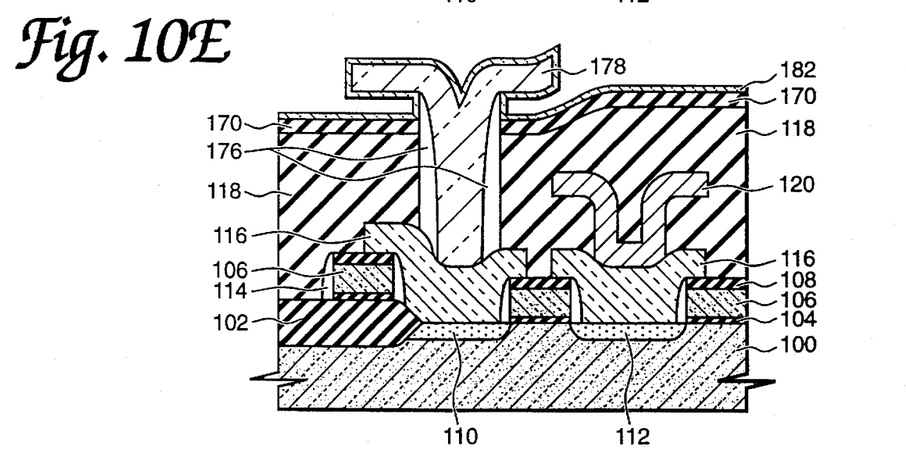

FIG. 10E is a diagram illustrating the step of forming a second conductive layer 182. After first conductive layer 178 is dry-etched using photoresist pattern 180 as a mask, photoresist pattern 180 is removed and then second insulating layer 174 is wet-etched. Here, as an etchant, a BOE or HF solution is used. Next, second conductive layer 182 such as the doped polysilicon layer is formed completely, covering the etched first conductive layer 178.

Figure 10F:
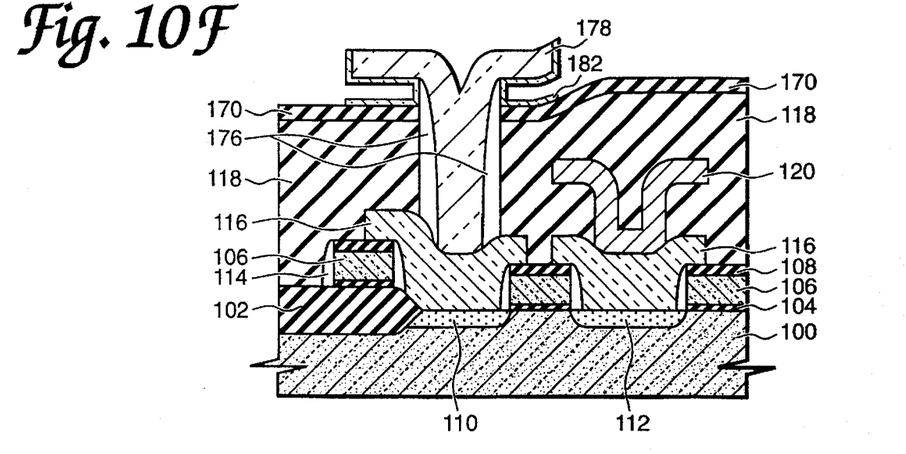

FIG. 10F is a diagram illustrating the step of forming a storage electrode. After second conductive layer 182 is dry-etched, storage electrode consisting of first conductive layer 178 and second conductive layer 182 is formed. Here, first conductive layer 178 is used as a mask.

According to the third preferred embodiment of the present invention, after the insulating spacer is formed inside contact hole, the first and second conductive layers are connected with each other outside rather than inside the contact hole, so that the first conductive layer becomes a fin of the storage electrode.

As described above, in the case where the capacitor having an SDF structure is applied to the COB structure, a problem related with the enlargement of the contact hole can be solved by forming the spacer, and a capacitor exhibiting high reliability can be manufactured since the BPSG insulating layer and the conductive layer do not contact each other. In addition, the conductive layers are electrically connected to become a fin of the storage electrode.

Particularly, according to the method for connecting two fins outside the contact hole (the third preferred embodiment), the step for forming the contact hole is very simple and one less photolithography step is required since the first conductive layer is used as a mask for etching the second conductive layer, thereby simplifying the manufacturing process.

The present invention is not limited to the particular forms illustrated and it is intended in the appended claims to cover all modifications that do not depart from the spirit and scope of this invention.

What is claimed is:

1. A method for manufacturing a capacitor of a semiconductor memory device, comprising the steps of:

sequentially forming a first insulating layer, a first conductive layer, a second insulating layer, and a second conductive layer whose etching selectivity ratio is smaller than that of the second insulating layer, on a semiconductor substrate on which a transistor comprising a source region, a drain region and a gate electrode, and a buried bit-line surrounded by an insulating film are formed;

forming a contact hole by sequentially etching a portion of said second conductive layer, said second insulating layer, said first conductive layer, said first insulating layer and said insulating film stacked on said source region, thereby exposing said source region of said transistor;

forming a spacer made of an insulating material on side walls of said contact hole, while exposing a portion of a side surface of said first conductive layer in said contact hole;

forming a third conductive layer on a whole surface of the resultant structure after forming said spacer;

forming a photoresist pattern on said third conductive layer for forming a storage electrode; and forming said storage electrode by sequentially etching a selected portion of said third conductive layer, second conductive layer, second insulating layer and first conductive layer.

2. A method for manufacturing a capacitor as claimed in claim 1, wherein said first and third conductive layers are made of polysilicon doped with arsenic ions or polysilicon doped with phosphorus through $POCl_3$ deposition.

3. A method for manufacturing a capacitor as claimed in claim 1, wherein said second conductive layer is made of polysilicon.

4. A method for manufacturing a capacitor as claimed in claim 1, wherein said first and second insulating layers are made of high-temperature oxide.

5. A method for manufacturing a capacitor as claimed in claim 1, wherein said spacer is made of $Si_3N_4$ or $SiON$.

6. A method for manufacturing a capacitor as claimed in claim 1, wherein a polysilicon pad layer is further formed on said drain and source regions before said bit-line is formed.

7. A method for manufacturing a capacitor as claimed in claim 1, wherein said storage electrode is formed by dry-etching said third conductive layer and said second conductive layer, wet-etching said second insulating layer and dry-etching said first conductive layer.

* * * * *